US010068919B2

(12) United States Patent
Yang (10) Patent No.: US 10,068,919 B2
(45) Date of Patent: Sep. 4, 2018

(54) SEMICONDUCTOR DEVICE AND METHOD OF FORMING THE SAME

(71) Applicant: UNITED MICROELECTRONICS CORP., Hsin-Chu (TW)

(72) Inventor: Chin-Sheng Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 10 days.

(21) Appl. No.: 14/714,352

(22) Filed: May 18, 2015

(65) Prior Publication Data

US 2016/0315100 A1 Oct. 27, 2016

(30) Foreign Application Priority Data

Apr. 21, 2015 (CN) .......................... 2015 1 0189060

(51) Int. Cl.
| | |
|---|---|
| *H01L 29/786* | (2006.01) |
| *H01L 27/12* | (2006.01) |
| *H01L 21/84* | (2006.01) |
| *H01L 27/06* | (2006.01) |
| *H01L 29/66* | (2006.01) |
| *H01L 21/8258* | (2006.01) |
| *H01L 27/092* | (2006.01) |
| *H01L 29/78* | (2006.01) |

(52) U.S. Cl.
CPC ........ *H01L 27/1207* (2013.01); *H01L 21/845* (2013.01); *H01L 27/0688* (2013.01); *H01L 27/1225* (2013.01); *H01L 21/8258* (2013.01); *H01L 27/092* (2013.01); *H01L 29/66545* (2013.01); *H01L 29/66636* (2013.01); *H01L 29/7842* (2013.01)

(58) Field of Classification Search
CPC ............ H01L 27/0886; H01L 29/6653; H01L 21/823431; H01L 29/161; H01L 21/823418; H01L 29/1608; H01L 29/24; H01L 21/823821; H01L 21/845; H01L 23/3672; H01L 123/3677; H01L 27/0924; H01L 27/10826; H01L 27/10879; H01L 127/1211; H01L 29/41791; H01L 29/66772; H01L 29/66795; H01L 29/66818; H01L 29/7831; H01L 29/785
See application file for complete search history.

(56) References Cited

U.S. PATENT DOCUMENTS

| | | | | |
|---|---|---|---|---|
| 5,872,029 | A * | 2/1999 | Gardner | .............. H01L 21/8221 257/E21.614 |
| 6,657,229 | B1 * | 12/2003 | Eguchi | ................. H01L 21/761 257/67 |
| 8,384,076 | B2 | 2/2013 | Park et al. | |
| 8,582,349 | B2 | 11/2013 | Yamazaki et al. | |
| 8,895,376 | B2 | 11/2014 | Saito et al. | |
| 2006/0292889 | A1 * | 12/2006 | Blanchard | .............. B82Y 10/00 438/761 |

(Continued)

*Primary Examiner* — Cuong B Nguyen
*Assistant Examiner* — Samuel Park
(74) *Attorney, Agent, or Firm* — Winston Hsu (57) ABSTRACT

A semiconductor device and a method of forming the same, the semiconductor device includes a first transistor and a second transistor. The first transistor is disposed on a substrate and comprises a gate electrode, a gate dielectric layer and a first source/drain. The second transistor includes the gate electrode and a channel layer disposed on the gate electrode.

8 Claims, 7 Drawing Sheets

(56) References Cited

U.S. PATENT DOCUMENTS

| | | | |
|---|---|---|---|
| 2007/0138559 A1* | 6/2007 | Bohr | H01L 21/28088 257/351 |
| 2011/0147737 A1* | 6/2011 | Yamazaki | H01L 27/11517 257/43 |
| 2012/0315735 A1 | 12/2012 | Koezuka et al. | |
| 2013/0043465 A1* | 2/2013 | Okazaki | H01L 29/7869 257/43 |
| 2013/0126868 A1 | 5/2013 | Yamazaki et al. | |
| 2013/0270616 A1 | 10/2013 | Yamazaki | |
| 2015/0171222 A1* | 6/2015 | Sasagawa | H01L 29/7869 257/43 |

* cited by examiner

SEMICONDUCTOR DEVICE AND METHOD OF FORMING THE SAME

BACKGROUND OF THE INVENTION

1. Field of the Invention

The invention relates to a semiconductor device and a method of forming the same, and more particularly, to a semiconductor device having two transistors sharing a same gate structure and a method of forming the same.

2. Description of the Prior Art

Conventional planar metal-oxide-semiconductor (MOS) transistors have difficulty when scaling down to 65 nm and below. For overcoming the process limitation, three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced accordingly.

However, integration of a metal gate and contact plugs still faces some issues in conventional FinFET fabrication. Hence, how to improve the current FinFET fabrication and structure for resolving such issue has become an important task in this field.

SUMMARY OF THE INVENTION

It is one of the primary objectives of the present invention to provide a semiconductor device and a method of forming the same, wherein the semiconductor device has two transistors which overlap and share the same gate structure with each other in a projecting direction, so as to achieve better element performance and integration.

To achieve the purpose described above, the present invention provides a semiconductor device including a first transistor and a second transistor. The first transistor is disposed on a substrate and comprises a gate electrode, a gate dielectric layer and a first source/drain. The second transistor includes the gate electrode and a channel layer disposed on the gate electrode.

To achieve the purpose described above, the present invention provides a method of forming a semiconductor device including following steps. First of all, a transistor is formed on a substrate, wherein the transistor includes a gate electrode and a first source/drain. Then, a channel layer is formed on the gate electrode to at least partially cover the gate electrode.

The semiconductor device and the method of forming the same of the present invention mainly fabricates a first transistor having a channel region disposed in the substrate, and then directly fabricates a channel layer and a source/drain which overlaps a part of the first transistor on a metal gate structure of the first transistor, thereby consisting of a second transistor by the channel layer, the source/drain and the metal gate structure of the first transistor. In this way, the two transistors are overlapped with each other in a projecting direction, and share the same metal gate structure, so as to achieve the purpose of providing better integration to the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
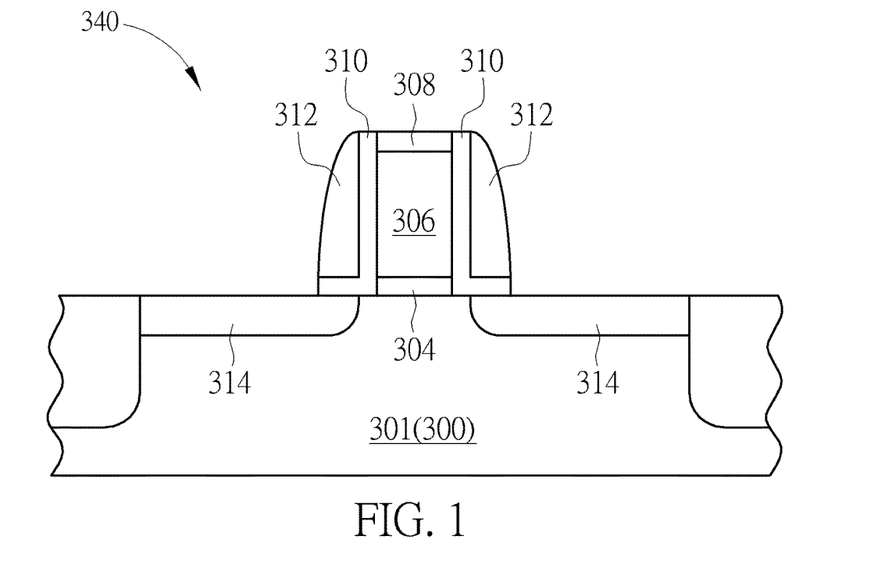
FIG. 1 to FIG. 8 are schematic diagrams illustrating a method of forming a semiconductor device according to a first embodiment of the present invention.

Please refer to FIG. 1 to FIG. 8, which are schematic diagrams illustrating a method of forming a semiconductor device according to the first embodiment of the present invention. First of all, as shown in FIG. 1, a substrate 300 is provided, the substrate 300 for example including a silicon substrate, an epitaxial silicon substrate, a silicon germanium substrate, silicon carbide substrate or a silicon-on-insulator (SOI) substrate, and at least one fin shaped structure 301 is formed on the substrate 300. The formation of the fin shaped structures 301 may include a photolithography-etching process (PEP) or a multi-patterning process, and is preferably through a spacer self-aligned double patterning (SADP) process. Namely, the fin shaped structures 301 may be formed preferably through a sidewall image transfer (SIT) technique, which includes forming a plurality of shallow trenches (not shown in the drawings) in the substrate 300, and filling an insulating layer in the shallow trenches to form a plurality of shallow trench isolations (STI) 302, and also to define portions of the substrate 300 protruded from the insulating layer being the fin shaped structures 301, but is not limited thereto.

Alternatively, in another embodiment, the formation of the fin shaped structures 301 may also be accomplished by first forming a patterned hard mask (not shown in the drawings) on the substrate 300, and then performing an epitaxial process on the exposed substrate 300 through the patterned hard mask to form a semiconductor layer (not shown in the drawings), such as a silicon or a silicon germanium layer. The semiconductor layer may then be used as the corresponding fin-shaped structure. Otherwise, in another embodiment including an SOI substrate (not shown in the drawings), a patterned hard mask (not shown in the drawings) may be used to etch a semiconductor layer (not shown in the drawings) of the substrate until reaching a bottom oxide layer (not shown in the drawings) underneath to form the corresponding fin-shaped structure.

Next, at least one transistor 340 is formed on the substrate 300. The transistor 340 includes an interfacial layer 304, a dummy gate electrode 306, a capping layer 308, a liner layer 310, a spacer 312 and a light doped source/drain (LDD) 314. In one embodiment, the interfacial layer 304 may include silicon oxide (SiO) or silicon nitride (SiN). The dummy gate electrode 306 may include undoped polysilicon material, doped polysilicon material, amorphous silicon material or a composition thereof. The capping layer 308 may include silicon dioxide ($SiO_2$), silicon nitride, silicon carbide (SiC) or silicon oxynitride (SiON). The liner layer 310 may include silicon oxide; and the spacer 312 may be a mono-layered structure or a multilayered structure including high temperature oxide (HTO), silicon nitride, silicon oxide, silicon oxynitride or silicon nitride formed by hexachloro-disilane ($Si_2Cl_6$) (HCD-SiN), but is not limited thereto.

Precisely speaking, in one embodiment of the present invention, the method of forming the transistor 340 may include sequentially forming an interfacial material layer (not shown in the drawings), a dummy gate material layer (not shown in the drawings) and a capping material layer (not shown in the drawings) stacked on the substrate 300, and patterning the stacked layers to form a gate structure of the transistor 340. After these, the liner layer 310 is formed on sidewalls of the gate structure, and the LDD 314 is formed in the fin shaped structure 301 at two sides of the gate structure. Lastly, the spacer 312 is formed on sidewalls of the liner layer 310. Please note that, the formation of the transistor 340 shown in FIG. 1 is not limited to the above-mentioned steps but may include other methods, which are well known by one skilled in the arts, and are not described in detail hereafter.

Figure 2:
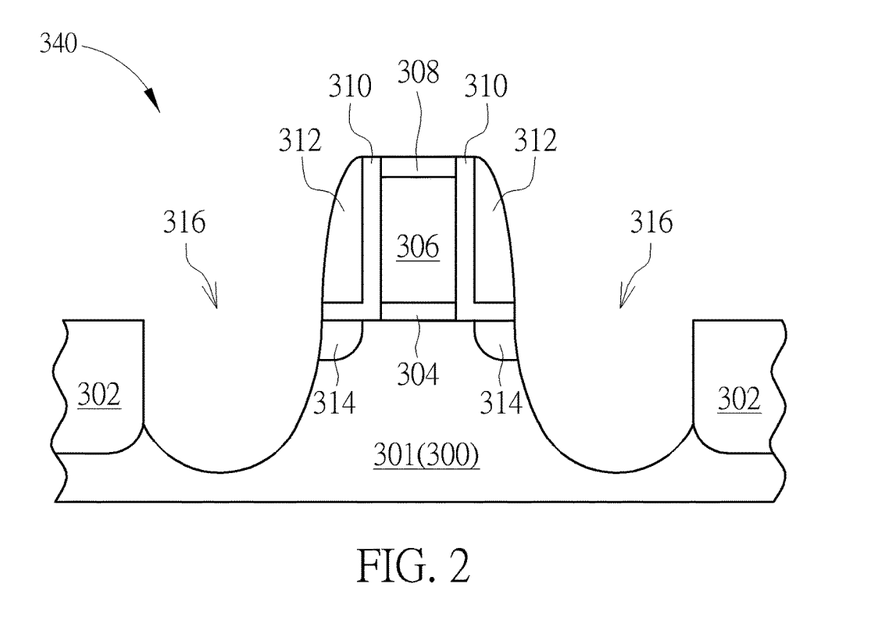
Figure 3:
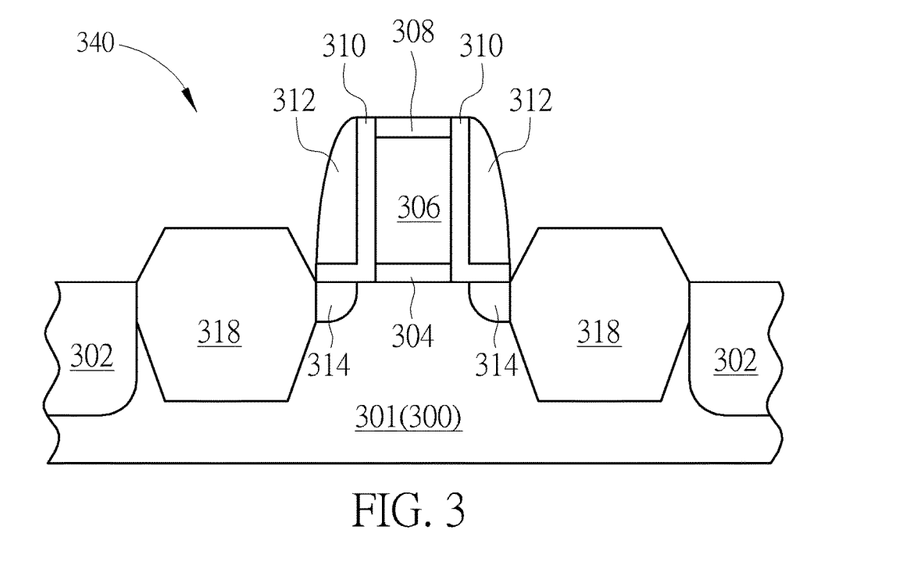

Then, as shown in FIG. 2 to FIG. 3, an epitaxial layer may be selectively formed in the fin shaped structure 301 or in the substrate 300, at two sides of the transistor 340, to configure as a source/drain 318. Precisely, the formation of the epitaxial layer may include first performing an etching process, such as a dry etching process, a wet etching process or a sequentially performed dry and wet etching process, to form at least one trench 316 in the fin shaped structure 301 or in the substrate 300, at two sides of the dummy gate electrode 306 and the spacer 312 of the gate structure of the transistor 340, as shown in FIG. 2. Subsequently, a selective epitaxial growth (SEG) process is carried out to form the epitaxial layer in the trench 316, as shown in FIG. 3.

In one embodiment of the present invention, the material of the epitaxial layer may be adjusted according to the type of the transistor 340. For example, when the transistor 340 is a PMOS, the epitaxial layer may include silicon germanium (SiGe), which can be doped in-situ with P-type dopants to form a P+ silicon germanium epitaxial layer thereby. By doing so, the subsequent source/drain ion implantation process for the PMOS may be omitted accordingly. On the contrary, when the transistor 340 is NMOS, the epitaxial layer may include silicon carbide, which can be doped in-situ with N-type dopants to form an N+ silicon carbide epitaxial layer thereby. However, the selective epitaxial growth process is not limited to the above-mentioned steps, and in another embodiment, may include additionally performing an ion implantation process either before or after the epitaxial layer is formed, to implant suitable dopants in the epitaxial layer to form the source/drain 318. Besides, the dopants may also be gradually arranged, or heterogeneous atoms (such as germanium or carbon atoms) may be further implanted in a gradual arrangement. Otherwise, in another embodiment, the epitaxial layer may be omitted, such that, a source/drain can be formed through directly performing an ion implantation process in the fin shaped structure 301 or in the substrate 300 at the two sides of the dummy gate electrode 306.

Figure 4:
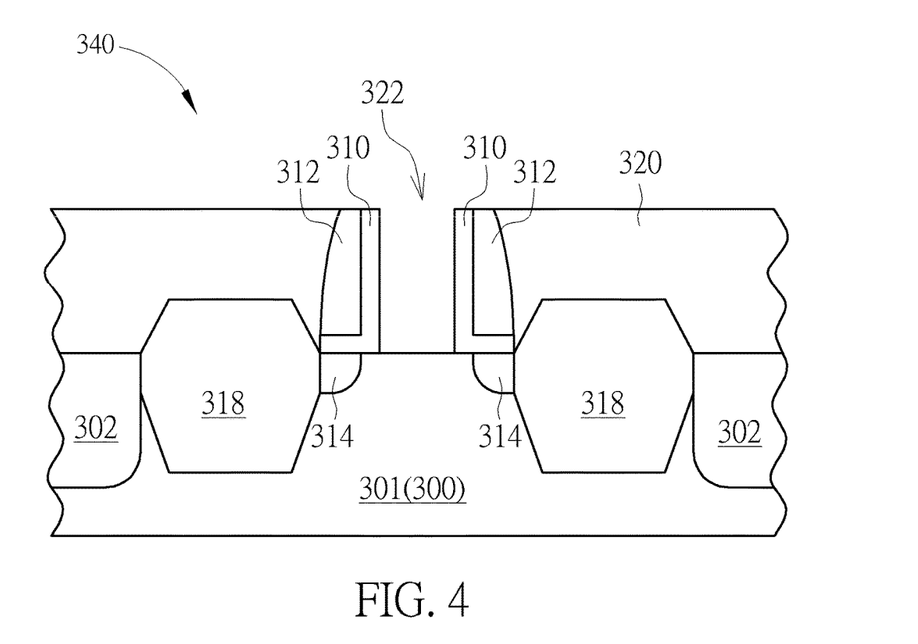
Figure 5:
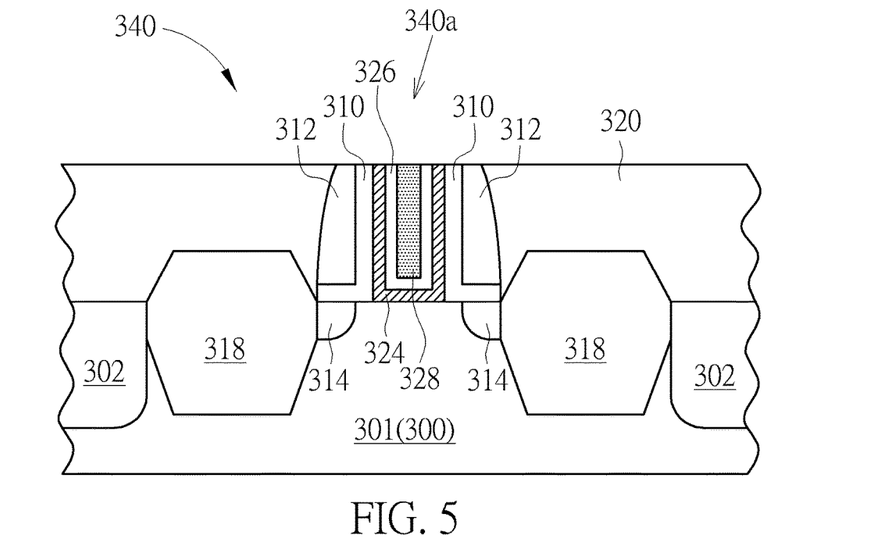

Next, as shown in FIG. 4 and FIG. 5, a replacement metal gate (RMG) process is performed, to replace the dummy gate electrode 306 of the transistor 340 into a metal gate. The formation of the metal gate includes firstly forming an interlayer dielectric material layer (not shown in the drawings), such as a silicon oxide layer, on the substrate 300, to entirely cover the transistor 340. After that, a planarization process is carried out, such as a chemical mechanical polish (CMP) process, an etching back process or a combination of both, to remove a part of the interlayer dielectric material layer to expose the gate structure, and to sequentially remove a part of the liner layer 310, a part of the spacer 312 and remove all of the capping layer 308 up to the exposure of a top surface of the dummy gate electrode 306. Subsequently, the dummy gate electrode 306 and the interfacial layer 304 are removed by using a dry etching and/or a wet etching, thereby forming a recess 322 in the transistor 340.

Following these, a high-k dielectric layer (not shown in the drawings), a work function metal material layer (not shown in the drawings) and a low resistance metal material layer (not shown in the drawings) are formed on the substrate 300, to at least fill the recess 322. Subsequently, a CMP process is carried out to remove the high-k dielectric layer, the work function metal material layer and the low resistance metal material layer that are outside the recess 322, thereby forming an interlayer dielectric layer 320 and a metal gate structure 340a as shown in FIG. 5. The metal gate structure 340a includes a gate dielectric layer 324, a work function metal layer 326, and a low resistance metal layer 328, configured as a metal gate of the metal gate structure 340a. However, the method of forming the metal gate structure 340a is not limited to the above-mentioned steps but may include other steps. For example, in one embodiment, a bottom barrier material layer (not shown in the drawings), such as a titanium (Ti)/titanium nitride (TiN) or tantalum (Ta)/tantalum nitride (TaN), may be optionally formed between the high-k dielectric layer and the work function metal material layer; or a top barrier material layer (not shown in the drawings), which substantially includes the same material as the bottom barrier layer, may be optionally formed between the work function metal material layer and the low resistance metal material layer. Then, a bottom barrier layer (not shown in the drawings) and/or a top barrier layer (not shown in the drawings) may be formed through the subsequently CMP process from the aforementioned bottom barrier material layer and/or the top barrier material layer.

Also, in one embodiment, the gate dielectric layer 324 may include hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The material of the work function metal layer 326 may be adjusted according to the type of the transistor 340. For example, when the transistor 340 is PMOS, the work function metal layer 326 required by a P-type transistor may include Ni, W, Mo, Ta, Ti, or NiN, WN, MoN, TaN, or TiN, but is not limited thereto. When the transistor 340 is NMOS, a work function metal layer 326 required by an N-type transistor may include titanium aluminides (TiAl), aluminum zirconium (ZrAl), aluminum tungsten (WAl), aluminum tantalum (TaAl) or aluminum hafnium (HfAl), but is not limited thereto. The low resistance metal layer 328 may include metal materials, such as aluminum, titanium, tantalum, tungsten, niobium (Nb), molybdenum, copper (Cu), titanium nitride, titanium carbide (TiC), tantalum nitride, titanium/tungsten or titanium/titanium nitride, but not limited thereto.

It is noted that the method of forming the transistor 340 having the metal gate is not limited to the above-mentioned steps but may include other steps. Also, although the above-mentioned embodiment is exemplified as a "gate-last" process and a "high-k last" process, but is not limited thereto. In another embodiment, it is understood that the transistor 340 in the present invention may also be fabricated through a "gate-first" process or a "high-k first" process, or a metal gate structure (not shown in the drawings) may also be directly formed on the substrate 300. Furthermore, in another embodiment, a monolayered or a miltilayered contact etch stop layer (CESL, not shown in the drawings) may be selectively formed before the interlayer dielectric material layer is formed, so that, a required compressive stress or stretching stress may be provided to the channel region of the transistor 340 disposed in the substrate 300, but is not limited thereto.

Figure 6:
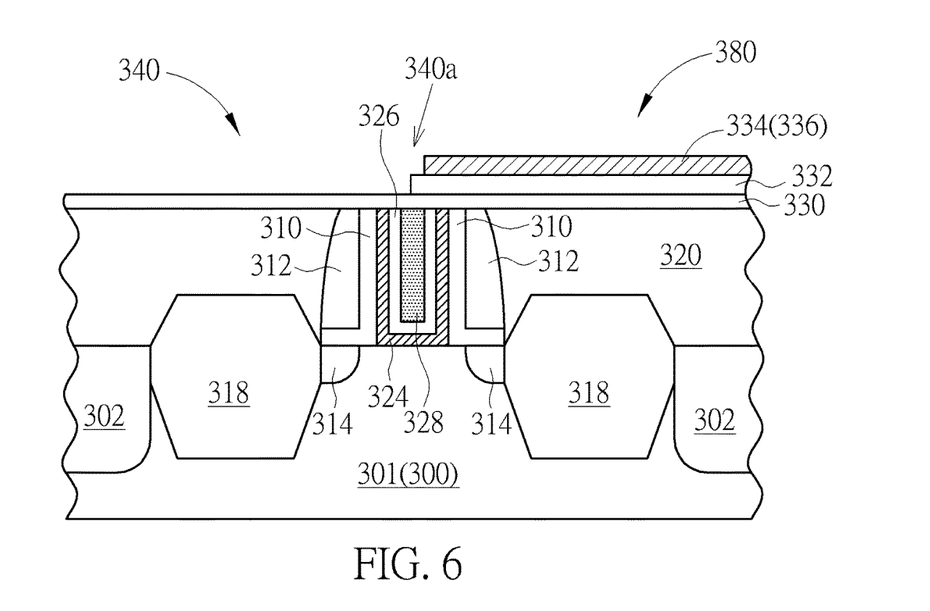
Figure 7:
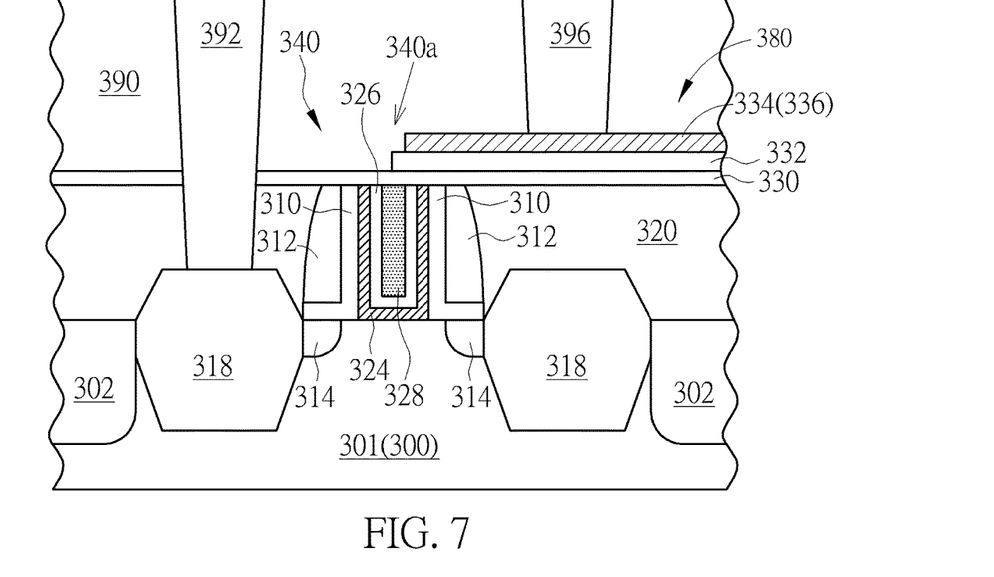
Figure 8:
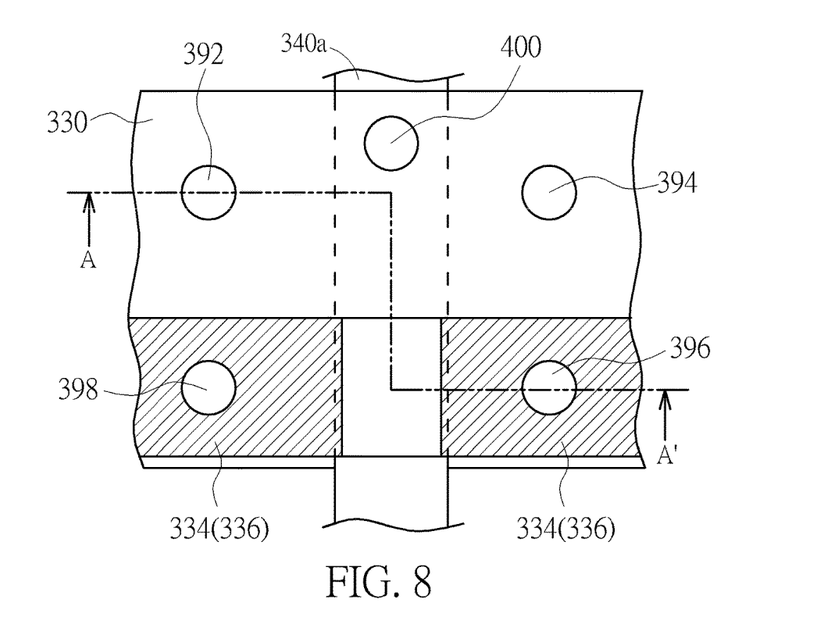

Then, as shown in FIG. 6 to FIG. 8, a transistor 380 which at least partially overlaps the transistor 340 is formed on the transistor 340, wherein FIG. 6 and FIG. 7 are cross-sectional schematic views taken along the cross line A-A' in FIG. 8. Specifically, the forming method of the transistor 380 may include sequentially forming a dielectric layer 330 and a channel material layer (not shown in the drawings) on the substrate 300 to entirely cover the substrate 300. The channel material layer may be formed through a chemical vapor deposition (CVD) process or a sputtering process, and the channel material layer is then patterned to form a channel layer 332 which covers a part of the dielectric layer 330. Please note that, the channel layer 332 is formed on the metal gate structure 340a of the transistor 340, and preferably overlaps a part of the metal gate structure 340a in a projecting direction perpendicular to the substrate 300, as shown in FIG. 8. Subsequently, as shown in FIG. 6, two conductive layers 334 are selectively formed on two sides of the channel layer 332, to configure as a source/drain 336, thereby forming the transistor 380. Otherwise, in another embodiment of forming the conductive layer, a channel layer (not shown in the drawings) covering a relative smaller area may be selectively formed, for example only approximately beyond the extending area of the metal gate structure 340a, and the conductive layer is then formed on two sides of the channel layer.

In one embodiment, the dielectric layer 330 may include insulating materials, such as silicon oxide, silicon nitride, silicon oxynitride or aluminum oxide, to configure as a gate dielectric layer of the transistor 380; and the channel layer 332 may be a semiconductor oxide material including at least one of indium (In), gallium (Ga), tin (Sn), zinc (Zn), aluminum (Al) and magnesium (Mg), such as indium gallium zinc oxide (IGZO), especially CAAC-IGZO having high carrier mobility and low leakage current, but is not limited thereto.

It is noteworthy that, the metal gate structure 340a of the transistor 340 is formed on the fin shaped structure 301 of the substrate 300, and the channel region (not shown in the drawings) thereof is disposed in the fin shaped structure 301 below the metal gate structure 340a; and the transistor 380 is invertedly disposed on the transistor 340, such that, the channel layer 332 and the source/drain 336 thereof may be disposed on the low resistance metal layer 328 (being configured as the metal gate of the transistor 380) and the dielectric layer 330 (being configured as the gate dielectric layer of the transistor 380). Through such performance, the transistor 380 and the transistor 340 may share the same metal gate structure 340a (including all elements thereof, such as the low resistance metal layer 328), and the metal gate structure 340a and the source/drain 336 are electrically connect through the channel layer 332. In other words, the transistor 380 and the transistor 340 partially overlap with each other, so as to achieve preferable integration. Also, in one embodiment, the conductive layers 334 may be selectively omitted, and a contact plug may be directly formed to electrically connect to the channel layer 332, thereby functioning as the source/drain of the transistor 380. In another embodiment, the transistor 380 and the transistor 340 preferably include different conductive types. For example, the transistor 340 is a P-type transistor, and the transistor 380 is an N-type transistor, so as to perform like a highly integrated complementary metal oxide semiconductor device, but is not limited thereto. In another embodiment, the transistor 340 and the transistor 380 may also include the same conductive type selectively, for example all of P-type transistors or N-type transistors.

Figure 10:
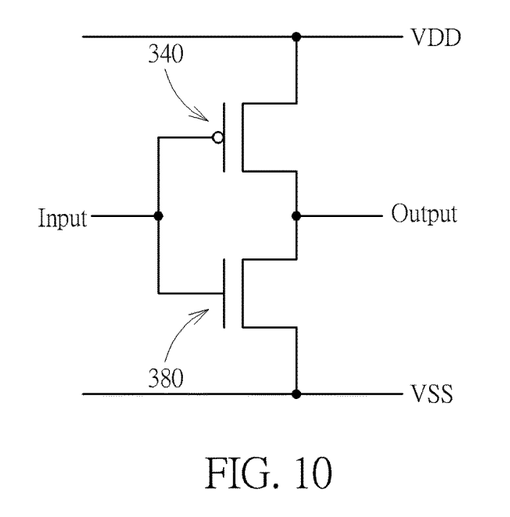
FIG. 10 is a schematic diagram illustrating an equivalent circuit of a semiconductor device according to one embodiment of the present invention.

Finally, as shown in FIG. 7 and FIG. 8, a source/drain contact plug forming process is performed, to respectively form contact plugs 392, 394 which are electrically connected to the source/drain 318 of the transistor 340, contact plugs 396, 398 which are electrically connected to the source/drain 336 of the transistor 380, and a contact plug 400 which is electrically connected to the shared metal gate structure 340a of the transistors 340, 380, so that, the equivalent circuit shown in FIG. 10 may be obtained. Precisely, the formation of the contact plugs 392, 394, 396, 398, 400 may include sequentially forming a interlayer dielectric layer 390 and a patterned mask (not shown in the drawings) on the substrate 300, and performing an etching process, such as a dry etching process, a wet etching process or a sequentially performed dry and wet etching process, through the patterned mask, to form contact trenches (not shown in the drawings) which expose the source/drain 318 of the transistor 340, the source/drain 336 of the transistor 380 and the shared metal gate structure 340a of the transistors 340, 380 respectively. Subsequently, the patterned mask is removed, and the contact plugs 392, 394, 396, 398 400 are formed respectively in the contact trenches, to electrically connect the source/drain 318 of the transistor 340, the source/drain 336 of the transistor 380 and the shared metal gate structure 340a of the transistors 340, 380 respectively, as shown in FIG. 8.

The method of forming the contact plugs 392, 394, 396, 398, 400 is not limited to the above-mentioned steps but may include other methods, which are well known by one skilled in the arts, and are not described in detail hereafter. In another embodiment, the contact trenches may all be defined through a single-patterning lithography (not shown in the drawings); or the contact trenches connected to the transistors 340, 380 may also be defined through a multi-patterning lithography (not shown in the drawings), for example by using photolithography-photolithography-etch (2P1E) steps, or photolithography-etch-photolithography-etch (2P2E) steps, but not limited thereto.

Through the above mentioned steps, the semiconductor device according to the first embodiment of the present invention is obtained. In the present embodiment, a first transistor having the channel region disposed in the substrate is firstly provided, and then, a channel layer and a source/drain which overlaps a part of the first transistor are formed directly on the metal gate structure of the first transistor, thereby consisting of a second transistor by the channel layer, the source/drain and the metal gate structure of the first transistor. In this way, the two transistors are overlapped with each other in a projecting direction, and share the same metal gate structure, so as to achieve the purpose of providing better integration.

Figure 9:
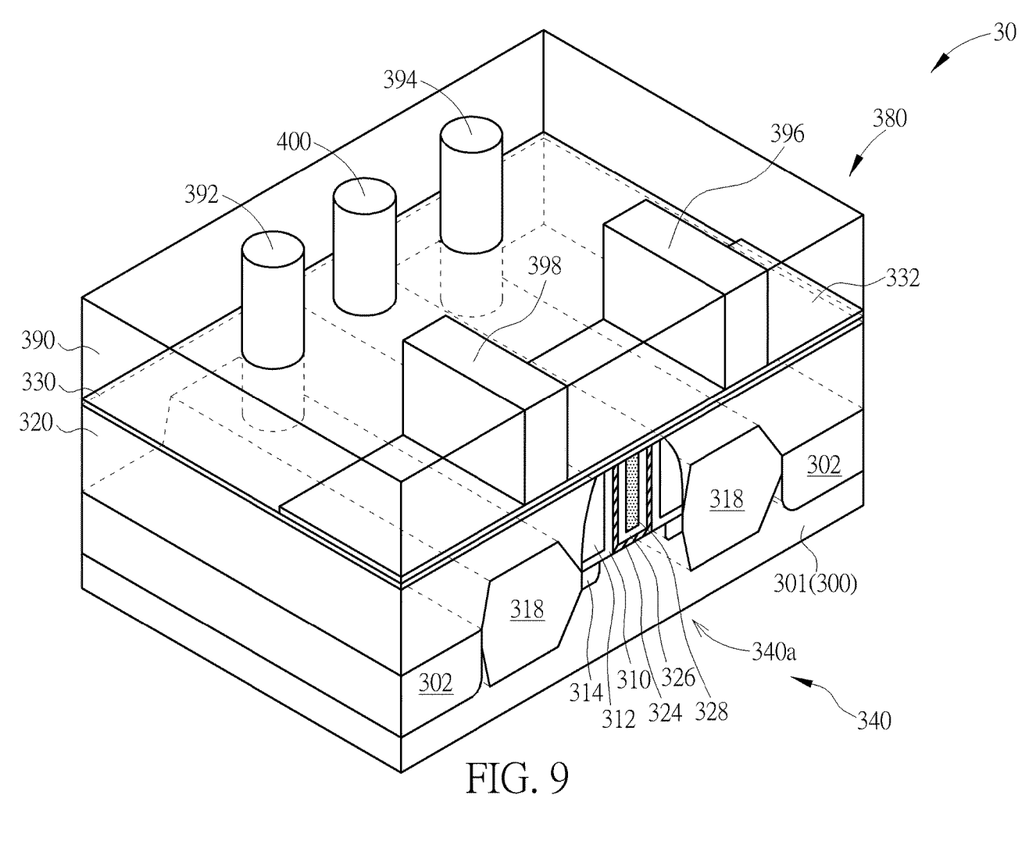
FIG. 9 is a schematic diagram illustrating a semiconductor device according to one embodiment of the present invention.
Figure 12:
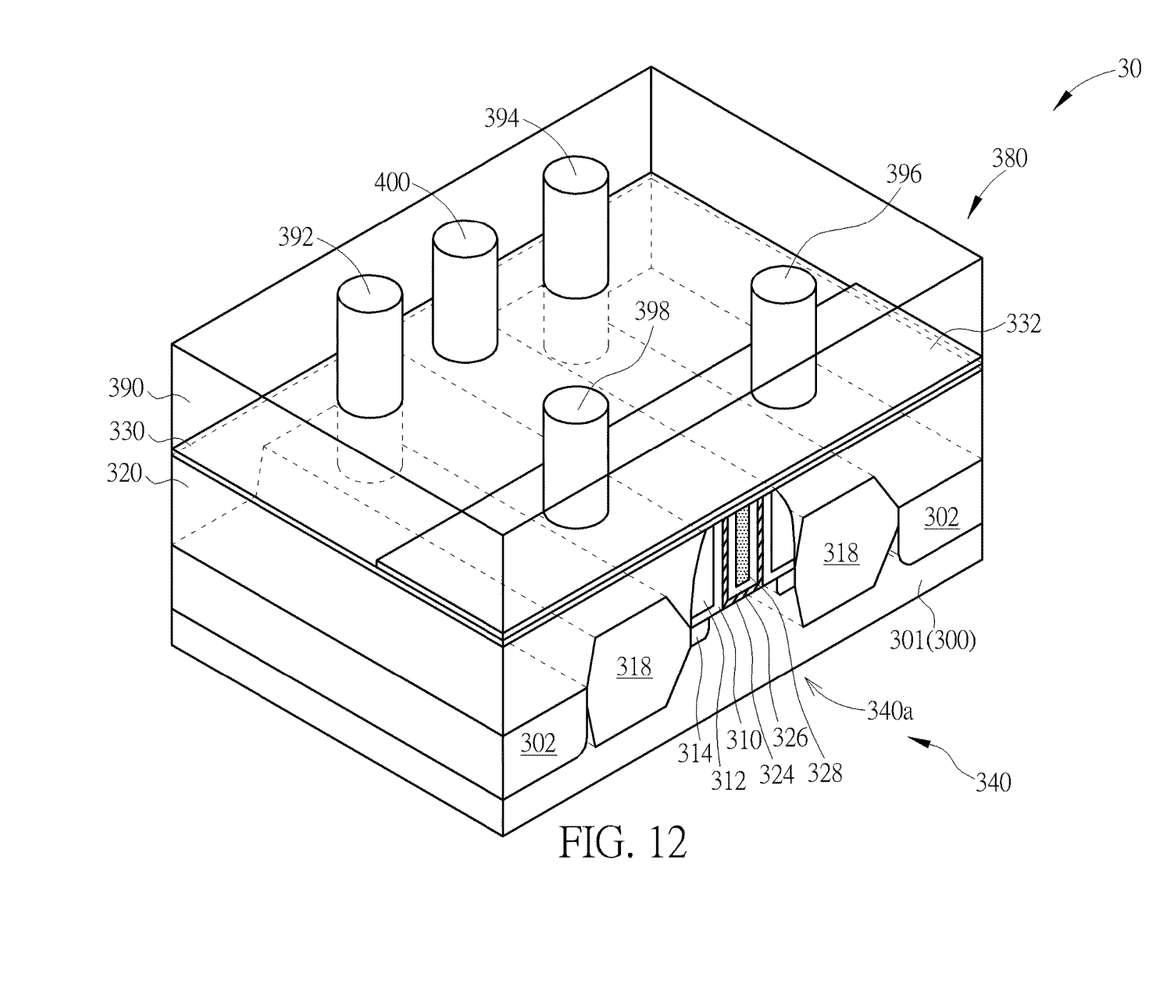
FIG. 12 is a schematic diagram illustrating another semiconductor device according to one embodiment of the present invention.

Furthermore, as shown in FIG. 9 and FIG. 12, FIG. 9 and FIG. 12 are schematic diagrams illustrating a semiconductor device 30 according to the preferred embodiment of the present invention. The semiconductor device 30 includes a first transistor 340 disposed on the substrate 300, wherein the first transistor 340 includes a gate dielectric layer 324, a work function metal layer 326, a low resistance metal layer 328, and a first source/drain 318; and a second transistor 380 including the low resistance metal layer 328, a dielectric layer 330 and a channel layer 332 and a second source/drain disposed on the low resistance metal layer 328 and the dielectric layer 330. It is worth mentioning that, the first source/drain 318 is disposed in the substrate, and preferably includes an epitaxial structure, and the second source/drain is disposed over the low resistance metal layer 328 and the dielectric layer 330, and covers the channel layer 332. In one embodiment, the second source/drain 336 may include the conductive layers 334 formed on the dielectric layer 330 and the channel layer 332 shown in FIG. 7, or directly utilize the contact plugs 396, 398 which are electrically connected to the channel layer 332 shown in FIG. 9 and FIG. 12 to function as the source/drain of the second transistor 380.

On the other hand, the channel layer 332 of the second transistor 380 may include a semiconductor oxide material including at least one of indium, gallium, tin, zinc, aluminum and magnesium, such as indium gallium zinc oxide, and the channel layer 332 is disposed on the metal gate structure 340a and at least partially overlaps the metal gate structure 340a in a projecting direction perpendicular to the substrate 300, as shown in FIG. 9. Thus, the second transistor 380 and the first transistor 340 may overlap with each other and share the same metal gate structure 340a. Also, in another embodiment, the first transistor 340 and the second transistor 380 preferably include different conductive types. For example, the first transistor 340 is a P-type transistor, and the second transistor 380 is an N-type transistor, so as to perform like a highly integrated complementary metal oxide semiconductor device.

Please note that, the method of forming the semiconductor device of the present invention is not limited to the above-mentioned steps but may include other methods. The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
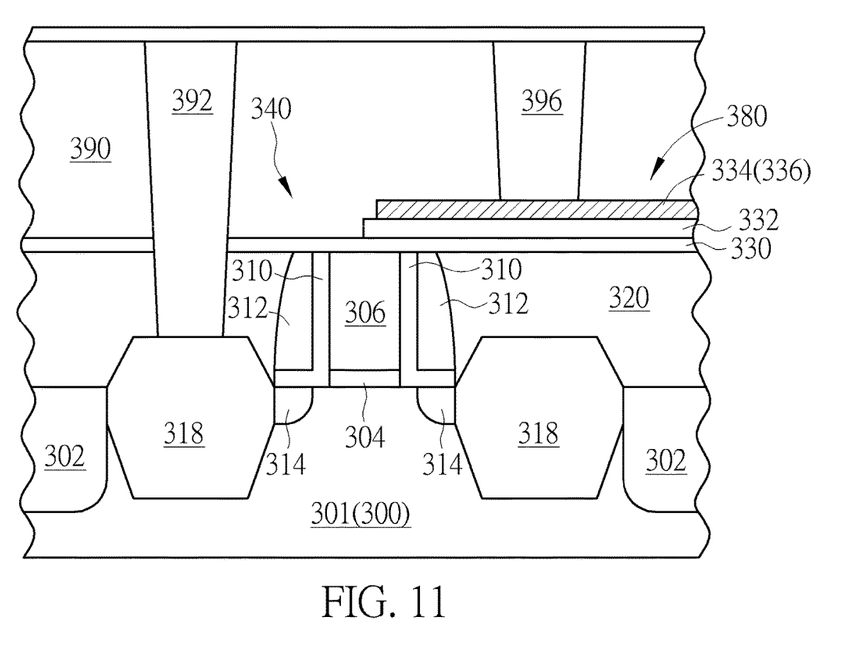
FIG. 11 is a schematic diagram illustrating a method of forming a semiconductor device according to a second embodiment of the present invention.

Please refer to FIG. 11, which is a schematic diagram illustrating a method of forming a semiconductor device according to the second embodiment of the present invention. The formal steps in the present embodiment are similar to those in the first embodiment, and the differences between the present embodiment and the aforementioned first embodiment are that, the replacement metal gate process is omitted in the present embodiment. Precisely, in the present embodiment, after the transistor 340 shown in FIG. 1 is formed, the interlayer dielectric material layer (not shown in the drawings) covering the substrate 300 and the transistor 340 entirely is formed. After these, a planarization process is carried out, such as a chemical mechanical polish process, an etching back process or a combination of both, is performed, to remove a part of the interlayer dielectric material layer to expose the gate structure, and then, the capping layer of the gate structure is removed, to form the interlayer dielectric layer 320 as shown in FIG. 11. Subsequently, as shown in FIG. 6 to FIG. 8, the transistor 380 and the contact plugs 392, 394, 396, 398, 400 electrically connected the transistor 340 and the transistor 380 are formed. It is noted that, the transistor 380 of the present embodiment consists of the dielectric layer 330 (to configure as the gate dielectric layer), the gate electrode 306, such as silicon gate, the channel layer 332 and the source/drain 336, so that, the transistor 340 and the transistor 380 may share the same gate electrode 306, thereby achieving the purpose of obtaining better integration to the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first transistor disposed on a substrate, the first transistor comprising a gate electrode, a spacer surrounding the gate electrode, a gate dielectric layer, a first source/drain, and a first channel disposed in the substrate, below the gate electrode;
a second transistor, comprising the gate electrode, a dielectric layer, a channel layer covered on the gate electrode and the dielectric layer, a second source/drain disposed on the channel layer, and a portion of the channel layer acts as a second channel, the second channel remains integral to the channel layer and is disposed between the second source/drain, the first channel only partially overlapping the second channel and an extending direction of the first channel being in a first direction while another extending direction of the channel layer being in a second direction being perpendicular to the first direction, wherein the second channel comprises a different material from that of the first channel, and the spacer is simultaneously and directly in contact with the gate dielectric layer of the first transistor and the dielectric layer of the second transistor; and
a plurality of contact plugs disposed on the first transistor and the second transistor and are electrically connected thereto respectively, wherein a first contact plug of the plurality of contact plugs electrically connected to the first source/drain does not overlap a second contact plug of the plurality of contact plugs electrically connected to the second source/drain in a projection direction.

2. The semiconductor device of claim 1, wherein the channel layer at least partially overlaps the gate electrode in a projecting direction being perpendicular to the substrate.

3. The semiconductor device of claim 1, wherein the second source/drain comprises conductive layers disposed on two sides of the second channel.

4. The semiconductor device of claim 1, wherein the first source/drain is disposed in the substrate.

5. The semiconductor device of claim 4, wherein the first source/drain comprises an epitaxial structure.

6. The semiconductor device of claim 1, wherein the first transistor and the second transistor comprises different conductive types.

7. The semiconductor device of claim 1, wherein the channel layer comprises indium gallium zinc oxide (IGZO).

8. The semiconductor device of claim 1, further comprising:
   a fin shaped structure disposed in the substrate, and the first source/drain is disposed in the fin shaped structure.

* * * * *